US009770887B2

(12) United States Patent
Gong et al.

(10) Patent No.: US 9,770,887 B2
(45) Date of Patent: *Sep. 26, 2017

(54) METALIZED PLASTIC ARTICLES AND METHODS THEREOF

(71) Applicant: BYD COMPANY LIMITED, Shenzhen, Guangdong (CN)

(72) Inventors: Qing Gong, Guangdong (CN); Liang Zhou, Guangdong (CN); Weifeng Miao, Guangdong (CN); Xiong Zhang, Guangdong (CN)

(73) Assignee: BYD COMPANY LIMITED, Shenzhen (CN)

( * ) Notice: Subject to any disclaimer, the term of this patent is extended or adjusted under 35 U.S.C. 154(b) by 281 days.

This patent is subject to a terminal disclaimer.

(21) Appl. No.: 14/462,293

(22) Filed: Aug. 18, 2014

(65) Prior Publication Data

US 2014/0356645 A1    Dec. 4, 2014

Related U.S. Application Data

(62) Division of application No. 13/186,280, filed on Jul. 19, 2011.

(30) Foreign Application Priority Data

Aug. 19, 2010    (CN) .......................... 2010 1 0260236

(51) Int. Cl.
| | |
|---|---|
| B05D 3/06 | (2006.01) |
| B05D 3/10 | (2006.01) |
| C23C 18/42 | (2006.01) |
| B32B 15/08 | (2006.01) |
| C23C 18/20 | (2006.01) |
| C23C 18/32 | (2006.01) |
| H05K 3/18 | (2006.01) |
| C23C 18/16 | (2006.01) |
| C23C 18/22 | (2006.01) |
| C23C 18/40 | (2006.01) |
| B32B 15/04 | (2006.01) |
| H05K 1/05 | (2006.01) |
| H05K 3/10 | (2006.01) |

(52) U.S. Cl.
CPC ............ *B32B 15/08* (2013.01); *B32B 15/043* (2013.01); *C23C 18/1639* (2013.01); *C23C 18/1641* (2013.01); *C23C 18/1651* (2013.01); *C23C 18/1653* (2013.01); *C23C 18/204* (2013.01); *C23C 18/2006* (2013.01); *C23C 18/2013* (2013.01); *C23C 18/22* (2013.01); *C23C 18/32* (2013.01); *C23C 18/40* (2013.01); *C23C 18/42* (2013.01); *H05K 1/056* (2013.01); *H05K 3/182* (2013.01); *H05K 3/105* (2013.01); *H05K 2201/09118* (2013.01); *H05K 2203/107* (2013.01); *Y10T 428/12569* (2015.01)

(58) Field of Classification Search
CPC ............ C23C 18/2006; C23C 18/1639; C23C 18/1651; C23C 18/204; C23C 18/40; C23C 18/2013; C23C 18/32
USPC .... 427/97.9, 98.1, 99.5, 304, 305, 306, 437, 427/438, 443.2, 553, 554, 555
See application file for complete search history.

(56) References Cited

U.S. PATENT DOCUMENTS

| | | |
|---|---|---|
| 3,056,881 A | 10/1962 | Schwarz |
| 3,226,256 A | 12/1965 | Schneble, Jr. et al. |
| 3,234,044 A | 2/1966 | Andes et al. |
| 3,305,460 A | 2/1967 | Lacy |
| 3,546,011 A | 12/1970 | Knorre et al. |
| 3,627,576 A | 12/1971 | Knorre et al. |
| 3,799,802 A | 3/1974 | Schneble, Jr. et al. |
| 3,804,740 A | 4/1974 | Welch |
| 3,846,460 A | 11/1974 | Fite, Jr. |
| 4,087,586 A | 5/1978 | Feldstein |
| 4,159,414 A | 6/1979 | Suh et al. |
| 4,416,932 A | 11/1983 | Nair |

(Continued)

FOREIGN PATENT DOCUMENTS

| | | |
|---|---|---|
| CN | 1370806 A | 9/2002 |
| CN | 1444632 A | 9/2003 |

(Continued)

OTHER PUBLICATIONS

Ahmed et al., "Laser induced structural and transport properties change in Cu—Zn ferrites", *J. Mater. Sci.*, vol. 42, 2007, pp. 4098-4109.
Boone, "Metallization and Structuring of Injection Molded Parts with Integrated Circuit Traces", *Electroplating*, D-88348 Saulgau, vol. 85, No. 4, 1994, pp. 1307-1319.
DeSilva et al., "A New Technique to Generate Conductive Paths in Dielectric Materials", *Mat. Res. Soc. Symp. Proc.*, vol. 323, 1994, pp. 97-102.
Eber-Gred, "Synthesis of Copper-Based Transparent Conductive Oxides with Delafossite Structure via Sol-Gel Processing", Dissertation, Würzburg, 2010 (208 pages).

(Continued)

*Primary Examiner* — Dah-Wei D Yuan
*Assistant Examiner* — Nga Leung V Law

(57) ABSTRACT

Metalized plastic substrates, and methods thereof are provided herein. The method includes providing a plastic substrate having a plurality of accelerators dispersed in the plastic substrate. The accelerators have a formula selected from the group consisting of: $CuFe_2O_{4-\delta}$, $Ca_{0.25}Cu_{0.75}TiO_{3-\beta}$, and $TiO_{2-\sigma}$, wherein $\delta$, $\beta$, $\sigma$ denotes oxygen vacancies in corresponding accelerators and $0.05 \leq \delta \leq 0.8$, $0.05 \leq \beta \leq 0.5$, and $0.05 \leq \sigma \leq 1.0$. The method further includes removing at least a portion of a surface of the plastic substrate to expose at least a first accelerator. The method further includes plating the exposed surface of the plastic substrate to form at least a first metal layer on the at least first accelerator, and then plating the first metal layer to form at least a second metal layer.

13 Claims, No Drawings

(56) References Cited

U.S. PATENT DOCUMENTS

| | | | |
|---|---|---|---|
| 4,426,442 A | 1/1984 | Molenaar et al. | |
| 4,550,140 A | 10/1985 | Rimsa et al. | |
| 4,555,414 A | 11/1985 | Hoover et al. | |
| 4,585,490 A | 4/1986 | Raffel et al. | |
| 4,767,665 A | 8/1988 | Seeger | |
| 4,772,496 A | 9/1988 | Maeda et al. | |
| 4,810,663 A | 3/1989 | Raffel et al. | |
| 4,841,099 A | 6/1989 | Epstein et al. | |
| 4,853,252 A | 8/1989 | Frankel et al. | |
| 4,894,115 A | 1/1990 | Eichelberger et al. | |
| 5,082,739 A | 1/1992 | Roy et al. | |
| 5,096,882 A | 3/1992 | Kato et al. | |
| 5,153,023 A | 10/1992 | Orlowski et al. | |
| 5,162,144 A | 11/1992 | Brown et al. | |
| 5,198,096 A | 3/1993 | Foust et al. | |
| 5,281,447 A | 1/1994 | Brady et al. | |
| 5,378,508 A | 1/1995 | Castro et al. | |
| 5,422,383 A | 6/1995 | Takahashi et al. | |
| 5,576,073 A | 11/1996 | Kickelhain | |
| 5,585,602 A | 12/1996 | Bernstein | |
| 5,599,592 A | 2/1997 | Laude | |
| 5,702,584 A | 12/1997 | Goenka et al. | |
| 5,838,063 A | 11/1998 | Sylvester | |
| 5,856,395 A | 1/1999 | Tanisho et al. | |
| 5,955,179 A | 9/1999 | Kickelhain et al. | |
| 6,194,032 B1 | 2/2001 | Svedberg et al. | |
| 6,198,197 B1 | 3/2001 | Yamanouchi et al. | |
| 6,277,319 B2 | 8/2001 | Hardgrove et al. | |
| 6,417,486 B1 | 7/2002 | Reil et al. | |
| 6,696,173 B1 | 2/2004 | Naundorf et al. | |
| 6,706,785 B1 | 3/2004 | Fu | |
| 6,743,345 B2 | 6/2004 | Belouet et al. | |
| 6,818,678 B2 | 11/2004 | Yamaguchi et al. | |
| 6,951,816 B2 | 10/2005 | Nopper et al. | |
| 7,060,421 B2 | 6/2006 | Naundorf et al. | |
| 7,576,140 B2 | 8/2009 | Tamaki et al. | |
| 8,841,000 B2 | 9/2014 | Gong et al. | |
| 8,846,151 B2 * | 9/2014 | Gong | C23C 18/2006 427/305 |
| 8,920,936 B2 | 12/2014 | Gong et al. | |
| 2002/0046996 A1 | 4/2002 | Reil et al. | |
| 2002/0076911 A1 | 6/2002 | Lin | |
| 2003/0031803 A1 | 2/2003 | Belouet et al. | |
| 2003/0042144 A1 | 3/2003 | Isono et al. | |
| 2003/0134558 A1 | 7/2003 | Lien et al. | |
| 2004/0010665 A1 | 1/2004 | Agarwal et al. | |
| 2004/0026254 A1 | 2/2004 | Hupe et al. | |
| 2004/0101665 A1 | 5/2004 | Seita et al. | |
| 2004/0241422 A1 | 12/2004 | Naundorf et al. | |
| 2005/0023248 A1 | 2/2005 | Ichimura et al. | |
| 2005/0064711 A1 | 3/2005 | Kliesch et al. | |
| 2005/0069688 A1 | 3/2005 | Kliesch et al. | |
| 2005/0269740 A1 | 12/2005 | Guns et al. | |
| 2006/0145782 A1 | 7/2006 | Liu et al. | |
| 2006/0286365 A1 | 12/2006 | Lee et al. | |
| 2007/0014975 A1 | 1/2007 | Ota | |
| 2007/0075050 A1 | 4/2007 | Heyl | |
| 2007/0154561 A1 | 7/2007 | Takeda et al. | |
| 2007/0247822 A1 | 10/2007 | Naundorf | |
| 2008/0015320 A1 | 1/2008 | Lee et al. | |
| 2008/0092806 A1 | 4/2008 | West et al. | |
| 2009/0292048 A1 | 11/2009 | Li et al. | |
| 2009/0292051 A1 | 11/2009 | Li et al. | |
| 2010/0021657 A1 | 1/2010 | Lochtman et al. | |
| 2010/0080958 A1 | 4/2010 | Goelling | |
| 2010/0266752 A1 | 10/2010 | Tseng et al. | |
| 2011/0048783 A1 | 3/2011 | Yu | |
| 2011/0177359 A1 | 7/2011 | Gong et al. | |
| 2011/0212344 A1 | 9/2011 | Gong et al. | |
| 2011/0212345 A1 | 9/2011 | Gong et al. | |
| 2011/0251326 A1 | 10/2011 | Van Hartingsveldt et al. | |
| 2011/0281135 A1 | 11/2011 | Gong et al. | |
| 2012/0045658 A1 | 2/2012 | Gong et al. | |
| 2012/0114968 A1 | 5/2012 | Gong et al. | |
| 2012/0121928 A1 | 5/2012 | Gong et al. | |

FOREIGN PATENT DOCUMENTS

| | | |
|---|---|---|
| CN | 1518850 A | 8/2004 |
| CN | 1523138 A | 8/2004 |
| CN | 1542547 A | 11/2004 |
| CN | 1666583 A | 9/2005 |
| CN | 1238572 C | 1/2006 |
| CN | 101113527 A | 1/2008 |
| CN | 101268134 A | 9/2008 |
| CN | 101299910 A | 11/2008 |
| CN | 101394710 A | 3/2009 |
| CN | 101634018 A | 1/2010 |
| CN | 101654564 A | 2/2010 |
| CN | 102071411 A | 5/2011 |
| CN | 102277569 A | 12/2011 |
| CN | 101747650 B | 1/2012 |
| DE | 19852776 A1 | 5/2000 |
| EP | 0230128 A2 | 7/1987 |
| EP | 0298345 A2 | 1/1989 |
| EP | 0311274 A2 | 4/1989 |
| EP | 1367872 A2 | 12/2003 |
| EP | 1650249 A1 | 4/2006 |
| EP | 1062850 B1 | 5/2007 |
| JP | 51-80347 | 7/1976 |
| JP | 52-079772 | 7/1977 |
| JP | 58-018932 | 2/1983 |
| JP | 61-185555 | 8/1986 |
| JP | 2-285076 | 11/1990 |
| JP | 2-305969 | 12/1990 |
| JP | 3-52945 | 3/1991 |
| JP | 2001-271171 | 10/2001 |
| JP | 2006-124701 | 5/2006 |
| JP | 2007-27312 | 2/2007 |
| RU | 2188879 C2 | 9/2002 |
| RU | 2192715 C1 | 11/2002 |
| WO | WO 98/44165 A1 | 10/1998 |
| WO | WO 00/15007 A1 | 3/2000 |
| WO | WO 00/35259 A2 | 6/2000 |
| WO | WO 03/005784 A2 | 1/2003 |
| WO | WO 2008/064863 A1 | 6/2008 |
| WO | WO 2009/009070 A1 | 1/2009 |
| WO | WO 2009/141800 A2 | 11/2009 |
| WO | WO 2010/022641 A1 | 3/2010 |
| WO | WO 2011/072506 A1 | 6/2011 |

OTHER PUBLICATIONS

Esser et al., "Laser Assisted Techniques for Patterning of Conductive Tracks on Molded Interconnect Devices", Proceedings of the Technical Program, 1998, pp. 225-233.

Gesemann et al., "Conducting paths: Laser beam sets germs, reinforced plating—Part 2", *PCB electroplating*, vol. 44, No. 7, 1990, pp. 329-331.

Marquardt et al., "Crystal chemistry and electrical properties of the delafossite structure", *Thin Solid Films*, vol. 496, 2006 (4 pages).

Shafeev, "Laser-assisted activation of dielectrics for electroless metal plating", *Appl. Phys. A.*, vol. 67, 1998, pp. 303-311.

Notice of Allowance dated Jan. 24, 2006, issued in U.S. Appl. No. 10/751,111 (13 pages).

Non-final Office Action dated Nov. 26, 2012, issued in related U.S. Appl. No. 13/103,859 (13 pages).

Final Office Action dated Jul. 12, 2013, issued in related U.S. Appl. No. 13/103,859 (15 pages).

Examiner's Answer to Appeal Brief dated Jan. 29, 2014, issued in related U.S. Appl. No. 13/103,859 (13 pages).

Non-final Office Action dated May 31, 2012, issued in U.S. Appl. No. 13/350,161 (12 pages).

Final Office Action dated Jan. 16, 2013, issued in U.S. Appl. No. 13/350,161 (8 pages).

Non-final Office Action dated Jul. 1, 2013, issued in U.S. Appl. No. 13/350,161 (9 pages).

Non-final Office Action dated Mar. 11, 2014, issued in U.S. Appl. No. 13/350,161 (10 pages).

Notice of Allowance dated Aug. 28, 2014, issued in U.S. Appl. No. 13/350,161 (6 pages).

(56) References Cited

OTHER PUBLICATIONS

Non-final Office Action dated Apr. 1, 2013, issued in related U.S. Appl. No. 12/950,904 (17 pages).
Final Office Action dated Jul. 22, 2013, issued in related U.S. Appl. No. 12/950,904 (14 pages).
Non-final Office Action dated Apr. 3, 2014, issued in related U.S. Appl. No. 12/950,904 (13 pages).
Final Office Action dated Aug. 18, 2014, issued in U.S. Appl. No. 12/950,904 (15 pages).
Non-final Office Action dated Nov. 29, 2012, issued in related U.S. Appl. No. 13/186,280 (19 pages).
Final Office Action dated Jul. 11, 2013, issued in related U.S. Appl. No. 13/186,280 (21 pages).
Notice of Allowance dated Jun. 5, 2014, issued in related U.S. Appl. No. 13/186,280 (11 pages).
Non-final Office Action dated May 25, 2012, issued in related U.S. Appl. No. 13/354,512 (12 pages).
Final Office Action dated Jan. 7, 2013, issued in related U.S. Appl. No. 13/354,512 (13 pages).
Non-final Office Action dated Jun. 25, 2013, issued in related U.S. Appl. No. 13/354,512 (12 pages).
Non-final Office Action dated Nov. 26, 2013, issued in related U.S. Appl. No. 13/354,512 (7 pages).
Notice of Allowance dated May 21, 2014, issued in related U.S. Appl. No. 13/354,512 (6 pages).
Non-final Office Action dated Apr. 9, 2013, issued in related U.S. Appl. No. 13/128,401 (39 pages).
Final Office Action dated Aug. 14, 2013, issued in related U.S. Appl. No. 13/128,401 (39 pages).
Non-final Office Action dated Oct. 1, 2014, issued in related U.S. Appl. No. 13/128,401 (30 pages).
Chinese First Office Action dated Jun. 16, 2011, issued in Chinese Application No. 200910261216.2 (10 pages).
Chinese First Office Action dated Jul. 28, 2011, issued in Chinese Application No. 200910238957.9 (16 pages).
Chinese First Office Action dated Jul. 28, 2011, issued in Chinese Application No. 201010044447.0 (8 pages).
Chinese First Office Action dated Aug. 4, 2011, issued in Chinese Application No. 201010117125.4 (9 pages).
Chinese First Office Action dated Aug. 5, 2011, issued in Chinese Application No. 201010260236.0 (9 pages).
Chinese First Office Action dated Aug. 1, 2012, issued in Chinese Application No. 201110202091.3 (8 pages).
Chinese First Office Action dated Aug. 1, 2012, issued in Chinese Application No. 201110202369.7 (8 pages).
Chinese First Office Action dated Sep. 5, 2012, issued in Chinese Application No. 201110202402.6 (8 pages).
European Examination Report dated Mar. 26, 2013, issued in European Application No. 10193044.4 (4 pages).
European Examination Report dated Oct. 1, 2013, issued in European Application No. 10827682.5 (5 pages).
European Examination Report dated Oct. 1, 2013, issued in European Application No. 13151234.5 (5 pages).
Extended European Search Report dated Mar. 31, 2011, issued in European Application No. 10193044.4 (11 pages).
Extended European Search Report dated Jun. 25, 2012, issued in European Application No. 10827682.5 (14 pages).
Extended European Search Report dated Apr. 5, 2013, issued in European Application No. 13151234.5 (5 pages).
Extended European Search Report dated Apr. 5, 2013, issued in European Application No. 13151235.2 (5 pages).
Extended European Search Report dated Apr. 5, 2013, issued in European Application No. 13151236.0 (5 pages).
Extended European Search Report dated Oct. 7, 2013, issued in European Application No. 13177928.2 (7 pages).
Partial European Search Report dated Feb. 7, 2011, issued in European Application No. 10193044.4 (6 pages).
Japanese Office Action dated Sep. 17, 2013, issued in Japanese Application No. 2012-505042 (6 pages).
Japanese Office Action dated Sep. 17, 2013, issued in Japanese Application No. 2012-506325 (6 pages).
Japanese Office Action dated Sep. 17, 2013, issued in Japanese Application No. 2012-506332 (7 pages).
Korean Office Action dated Mar. 15, 2013, issued in Korean Application No. 10-2011-7020318 (9 pages).
Korean Office Action dated Mar. 15, 2013, issued in Korean Application No. 10-2011-7020319 (7 pages).
Korean Office Action dated Mar. 15, 2013, issued in Korean Application No. 10-2011-7020337 (9 pages).
Korean Office Action dated Jul. 1, 2013, issued in Korean Application No. 10-2011-7020318 (4 pages).
Korean Office Action dated Jul. 1, 2013, issued in Korean Application No. 10-2011-7020319 (6 pages).
Korean Office Action dated Jul. 1, 2013, issued in Korean Application No. 10-2011-7020337 (5 pages).
Korean Office Action dated Jul. 1, 2013, issued in Korean Application No. 10-2013-7012557 (8 pages).
Korean Office Action dated Jul. 1, 2013, issued in Korean Application No. 10-2013-7013356 (8 pages).
Korean Office Action dated Jul. 1, 2013, issued in Korean Application No. 10-2013-7013357 (4 pages).
Korean Office Action dated Jul. 1, 2013, issued in Korean Application No. 10-2013-7013358 (4 pages).
Korean Office Action dated Oct. 18, 2013, issued in Korean Application No. 10-2011-7020319 (10 pages).
Korean Office Action dated Oct. 18, 2013, issued in Korean Application No. 10-2011-7020337 (8 pages).
Korean Office Action dated Oct. 18, 2013, issued in Korean Application No. 10-2013-7012557 (7 pages).
Korean Office Action dated Oct. 18, 2013, issued in Korean Application No. 10-2013-7013356 (6 pages).
Korean Office Action dated Oct. 18, 2013, issued in Korean Application No. 10-2013-7013357 (9 pages).
Korean Office Action dated Oct. 18, 2013, issued in Korean Application No. 10-2013-7013358 (10 pages).
PCT International Search Report and Written Opinion mailed Sep. 23, 2010, issued in International Application No. PCT/CN2010/072055 (12 pages).
PCT International Search and Written Opinion dated Oct. 28, 2010, issued in International Application No. PCT/CN2010/075232 (12 pages).
PCT International Search and Written Opinion dated Feb. 24, 2011, issued in International Application No. PCT/CN2010/078700 (15 pages).
PCT International Search and Written Opinion dated Nov. 24, 2011, issued in International Application No. PCT/CN2011/078487 (12 pages).

* cited by examiner

METALIZED PLASTIC ARTICLES AND METHODS THEREOF

CROSS-REFERENCE TO RELATED APPLICATION

This application is a divisional of U.S. patent application Ser. No. 13/186,280, entitled "Metalized Plastic Articles and Methods Thereof," filed on Jul. 19, 2011, which claims priority to and benefit of Chinese Patent Application No. CN201010260236.0, filed with State Intellectual Property Office, P.R.C., on Aug. 19, 2010. The above referenced applications are hereby incorporated by reference in their entirety.

FIELD OF THE PRESENT DISCLOSURE

The present disclosure relates generally to plastic articles. In more particularity, the present disclosure relates to a surface metallization method for the same.

BACKGROUND OF THE PRESENT DISCLOSURE

Metalization, also spelled metallization, is the process in which a non-metal substrate, such as a plastic, is coated, deposited, or otherwise provided, with a metallic layer or plating. Without wishing to be bound by the theory, Applicant believes that the metalization process may improve the substrates' ability to transmit, or otherwise transfer, electric and/or magnetic signals.

SUMMARY OF THE DISCLOSURE

In accordance with various illustrative embodiments hereinafter disclosed are methods of metalizing a plastic substrate. The method may include providing a plastic substrate having a plurality of accelerators dispersed in the plastic substrate. The accelerators may have a formula selected from the group consisting of: $CuFe_2O_{4-\delta}$, $Ca_{0.25}Cu_{0.75}TiO_{3-\beta}$, and $TiO_{2-\sigma}$, wherein $\delta$, $\beta$, $\sigma$ denotes oxygen vacancies in corresponding accelerators and $0.05 \leq \delta \leq 0.8$, $0.05 \leq \beta \leq 0.5$, and $0.05 \leq \sigma \leq 1.0$. The method may include removing at least a portion of a surface of the plastic substrate to expose at least a first accelerator. The method may further include plating the exposed surface of the plastic substrate to form at least a first metal layer on the at least first accelerator, and then plating the first metal layer to form at least a second metal layer.

In accordance with another illustrative embodiment hereinafter disclosed are plastic articles comprising: a plastic substrate having a plurality of accelerators plated with at least first and second metal layers, wherein the accelerators having a formula selected from the group consisting of: $CuFe_2O_{4-\delta}$, $Ca_{0.25}Cu_{0.75}TiO_{3-\beta}$, and $TiO_{2-\sigma}$, wherein $\delta$, $\beta$, $\sigma$ denotes oxygen vacancies in corresponding accelerators and $0.05 \leq \delta \leq 0.8$, $0.05 \leq \beta \leq 0.5$, and $0.05 \leq \sigma \leq 1.0$.

While the metalized plastic substrates and methods thereof will be described in connection with various preferred illustrative embodiments, it will be understood that it is not intended to limit the metalized plastics and methods thereof to those embodiments. On the contrary, it is intended to cover all alternatives, modifications, and equivalents as may be included within the spirit and scope of the invention as defined by the appended claims.

DETAILED DESCRIPTION OF THE EMBODIMENT

In an illustrative, non-limiting, embodiment of the present disclosure, a method of metalizing a plastic substrate is provided. The method may include providing a plastic substrate having a plurality of accelerators dispersed in the plastic substrate. The accelerators may have a formula selected from the group consisting of: $CuFe_2O_{4-\delta}$, $Ca_{0.25}Cu_{0.75}TiO_{3-\beta}$, and $TiO_{2-\sigma}$, wherein $\delta$, $\beta$, $\sigma$ denotes oxygen vacancies in corresponding accelerators and $0.05 \leq \delta \leq 0.8$, $0.05 \leq \beta \leq 0.5$, and $0.05 \leq \sigma \leq 1.0$. The method may include the step of removing at least a portion of a surface of plastic substrate to expose at least a first accelerator. In an embodiment, a determined, or predetermined, portion of a surface of the plastic substrate may be removed to expose at least a first accelerator. The method may further include plating the exposed surface of the plastic substrate to form at least a first metal layer on the at least first accelerator, and then plating the first metal layer to form at least a second metal layer.

In another illustrative, non-limiting, embodiment of the present disclosure, a plastic substrate may have a plurality of accelerators plated with at least a first and a second metal layers. The accelerators may have a formula selected from the group consisting of: $CuFe_2O_{4-\delta}$, $Ca_{0.25}Cu_{0.75}TiO_{3-\beta}$, and $TiO_{2-\sigma}$, wherein $\delta$, $\beta$, $\sigma$ denotes oxygen vacancies in corresponding accelerators and $0.05 \leq \delta \leq 0.8$, $0.05 \leq \beta \leq 0.5$, and $0.05 \leq \sigma \leq 1.0$. The structure of the first and second metal layers may be the same or different and may each be independently from each other selected from the group consisting of: Ni—Cu—Ni, or Ni—Cu—Ni—Au, or Cu—Ni, or Cu—Ni—Au.

Accelerators

In an illustrative, non-limiting, embodiment, the accelerators may have a formula selected from the group consisting of: $CuFe_2O_{4-\delta}$, $Ca_{0.25}Cu_{0.75}TiO_{3-\beta}$, and $TiO_{2-\sigma}$, wherein $\delta$, $\beta$, $\sigma$ denotes oxygen vacancies in corresponding accelerators and $0.05 \leq \delta \leq 0.8$, $0.05 \leq \beta \leq 0.5$, and $0.05 \leq \sigma \leq 1.0$ In a non-limiting embodiment, the mean average diameter of each accelerator may range from about 3 nanometers to about 200 microns, alternatively from about 20 nanometers to about 100 microns, and alternatively from about 10 nanometers to about 50 microns. The accelerators may be from about 1 wt % to about 40 wt % of the plastic substrate, based on the total weight of the plastic substrate, alternatively from about 1 wt % to about 30 wt %, and alternatively from about 2 wt % to about 15 wt %.

In a further non-limiting embodiment, particularly suitable accelerators may include: $CuFe_2O_{3.65}$, $CuFe_2O_{3.2}$, $Ca_{0.25}Cu_{0.75}TiO_{2.84}$, $Ca_{0.25}Cu_{0.75}TiO_{2.5}$, $TiO$, and $TiO_{1.9}$. Still further suitable accelerators, without limitation, may include $CuFe_2O_{3.65}$, $Ca_{0.25}Cu_{0.75}TiO_{2.84}$, and $TiO$.

The accelerators may be commercially available, or prepared by any technique known to those skilled in the art. For example one non-limiting suitable method for preparing the accelerators includes: preparing metal oxides/composite metal oxides by any technique know to those skilled in the art, such as co-precipitation, sol-gel, hydrothermal process, solid state sintering, etc., or obtaining commercially available metal oxides/composite metal oxides; calcining the metal oxides/composite metal oxides at high temperature in the presence of hydrogen, and/or one or more inert gases, to form oxygen vacancies thereof to obtain the accelerator.

Methods of preparing accelerators are generally known. In one non-limiting example, a method for preparing $CuFe_2O_{4-\delta}$ may comprise: adding a mixture of $Cu(NO_3)_2$ and Fe(NO$_3$)$_3$ into a stirring potassium hydroxide solution by a peristaltic pump with a speed of 1 milliliter per minutes; heating the solution to a temperature of 80° C. and constantly stirring for 24 hours, preferably the PH value of the solution is maintained at 10 to 11 while stirring; the precipitates in the solution may be cleaned and penetrated with distilled water and acetone; the penetrated precipitates may be dried at a temperature of about 120° C. for a time of about 24 hours and then granulated to about 300 meshes to form a first end product; the first end product may be calcined at a temperature of about 1000° C. for a time of about 4 to about 6 hours in the presence of high purity nitrogen to form CuFe$_2$O$_{4-\delta}$ (0.05≤δ≤0.8).

Similarly, a method for preparing Ca$_{0.25}$Cu$_{0.75}$TiO$_{3-\beta}$ may comprise similar steps. A method for preparing TiO$_{2-\alpha}$ may comprise calcining nano-titanium dioxide in the presence of nitrogen or reduced with reduction materials (such as NH$_3$, H$_2$, and Mg) to remove oxygen in the titanium dioxide. The nano-titanium dioxide may be commercially available.

In a non-limiting embodiment, commercially available accelerators may be titanium black (Tilack) obtained from Akoh Kasei, Japan, or titanium black (Tilox) obtained from Bo Kwang, Korea.

According to embodiments of the present disclosure, the accelerators may not be reduced to metals or activated. The accelerators may be used directly as chemical catalysts. Without wishing to be bound by the theory, Applicant believes that plating on the accelerators may help prevent plastic degradation.

In a further illustrative, non-limiting, embodiment, the accelerators may be randomly or approximately uniformly dispersed within the plastic. Without wishing to be bound by the theory, Applicant believes that approximate uniform dispersion of the accelerator in the plastic may aid in forming a strong adhesion between the metal layer and the plastic substrate. Without wishing to be bound by the theory, Applicant believes that the power, or energy, required to remove at least a portion of a surface of the plastic substrate to expose at least a first accelerator may be relatively low, and no extra/high power is needed to reduce the accelerators to pure metals. Thus, Applicant believes that in various embodiments of the present disclosure, the method may have relatively low energy or power requirements, low production costs, and be may relatively simple to perform.

In a further non-limiting embodiment, the accelerator may be a metal oxide or a metal composite oxide having oxygen vacancies. According to embodiments of the present disclosure, the metal oxide or metal composite oxide having oxygen vacancies may have strong reducibility and instability. For example and without wishing to be bound by the theory, the accelerator CuFe$_2$O$_x$ (x<4) may have relatively strong reducibility and instability due to at least the following: a) CuFe$_2$O$_x$(x<4) has oxygen vacancies and oxygen may be efficiently combined to crystal lattice of CuFe$_2$O$_x$ (x<4); b) in CuFe$_2$O$_x$(x<4) the electron transfer may exist not only between Cu$^+$ and Cu$^{2+}$, Fe$^{2+}$ and Fe$^{3+}$, but also between Cu$^+$ and Fe$^{3+}$, thus, electron transfer may cause the lost of electrons which indicates a strong reducibility; and c) during the period of forming oxygen vacancies in CuFe$_2$O$_4$, a large amount of cations may be combined in the crystalline lattice thereof, causing a extension of crystalline lattice gap, change of crystalline lattice, and the increasing of chemical potential energy. Therefore without wishing to be bound by the theory, CuFe$_2$O$_x$(x<4) with oxygen vacancies may have a relatively instable structure and oxygen ions may be needed to fill the oxygen vacancies, which may form a strong reducibility.

According to various embodiments of the present disclosure, the metal oxide or metal composite oxide with a certain range of oxygen vacancies may be used as accelerators, and metal layers may be plated directly on the accelerators.

Plastic Substrate

In an illustrative, non-limiting, embodiment, the plastic substrate may be predominantly formed of a plastic material. In an embodiment, the plastic material may be a thermoplastic plastic, or thermoset otherwise called a thermosetting plastic. Without limitation, the thermoplastic plastic may be selected from the group consisting of polyolefin, polyester, polyamide, polyaromatic ether, polyester-imide, polycarbonate (PC), polycarbonate/acrylonitrile-butadiene-styrene composite (PC/ABS), polyphenylene oxide (PPO), polyphenylene sulfide (PPS), polyimide (PI), polysulfone (PSU), poly (ether ether ketone) (PEEK), polybenzimidazole (FBI), liquid crystalline polymer (LCP), and combinations thereof. Without limitation, the polyolefin may be polystyrene (PS), polypropylene (PP), polymethyl methacrylate (PMMA) or acrylonitrile-butadiene-styrene (ABS); the polyester may be polycyclohexylene dimethylene terephthalate (PCT), poly (diallyl isophthalate) (PDAIP), poly(diallyl terephthalate) (PDAP), polybutylene naphthalate (PBN), Poly(ethylene terephthalate) (PET), or polybutylene terephthalate (PBT); the polyamide may be polyhexamethylene adipamide (PA-66), Nylon 69 (PA-69), Nylon 64 (PA-64), Nylon 612 (PA-612), polyhexamephylene sebacamide (PA-610), Nylon 1010 (PA-1010), Nylon 11 (PA-11), Nylon 12 (PA-12), Nylon 8 (PA-8), Nylon 9 (PA-9), polycaprolactam (PA-6), poly(p-phenytene terephthalamide) (PPTA), poly-meta-xylylene adipamide (MXD6), polyhexamethylene terephthalamide (PA6T), and Nylon 9T (PA9T). Without limitation, the thermoset may be one or more members selected from the group consisting of phenolic resin, urea-formaldehyde resin, melamine-formaldehyde resin, epoxy resin, alkyd resin, polyurethane, and combinations thereof.

Dispersion of Accelerator(s) in Plastic Substrate

In an illustrative, non-limiting, embodiment, the accelerator(s) may be dispersed within the plastic substrate by any method of mixture or combination, followed, without limitation, by a molding process. In various embodiments, the accelerator(s) may become dispersed in the plastic substrate by using an internal mixer, a singer screw extruder, a twin screw extruder or a mixer. Then, a plastic substrate may be formed with various kinds of shapes during an injection molding, blow molding, extraction molding, or hot press molding processes.

Additives

In illustrative, non-limiting, embodiments, the plastic substrate may further comprise one or more generally known, and commercially available, additives selected from the group consisting of: an antioxidant; a light stabilizer; a lubricant; and inorganic fillers.

In a non-limiting embodiment, the antioxidant may be antioxidant 1098, 1076, 1010, 168 available from CIBA Holding Inc., located in Switzerland. The antioxidant may be about 0.01 wt % to about 2 wt % of the plastic substrate, based on the total weight of the plastic substrate.

The light stabilizer may be any such commercially available product, including a hindered amine light stabilizer, such as light stabilizer 944 available from CIBA Holding Inc., located in Switzerland. The light stabilizer may be about 0.01 wt % to about 2 wt % of the plastic substrate, based on the total weight of the plastic substrate.

In a non-limiting embodiment, the lubricant may be selected from the group consisting of: methylpolysiloxanes; EVA waxes formed from ethylene and vinyl acetate; polyethylene waxes; stearates; and combinations thereof. The lubricant may be about 0.01 wt % to about 2 wt % of the plastic substrate, based on the total weight of the plastic substrate.

In a non-limiting embodiment, the inorganic filler may be talcum powders, calcium carbonates, glass fibers, calcium silicate fibers, tin oxides, or carbon blacks. Glass fibers may increase the depth of exposed determined area favoring copper adhesion in further copper plating step; and tin oxide or carbon black may improve removing speed of the plastic during the removing step to shorten the process period. In further embodiments, the inorganic filler may further be selected from the group consisting of glass beads, calcium sulfates, barium sulfates, titanium dioxides, pearl powders, wollastonites, diatomites, kaolins, pulverized coals, pottery clays, micas, oil shale ashes, aluminosilicates, aluminas, carbon fibers, silicon dioxides, zinc oxides, and combinations thereof, particularly those without harmful elements (Cr, etc) to the environment and human health. The inorganic filler may be about 1 wt % to about 70 wt % of the plastic substrate, based on the total weight of the plastic substrate.

Plastic Removal

In an illustrative, non-limiting, embodiment, at least a portion of a surface of the plastic substrate may be removed to expose at least a first accelerator. In an embodiment, at least a portion of plastic in a determined/predetermined area of the surface of the plastic substrate may be removed to expose at least a first accelerator. In an embodiment, the removal of plastic may be achieved by any know method in the art. In an embodiment, the determined/predetermined area may be the entire surface of the plastic substrate. Optionally, plastic of the surface of the plastic substrate may be removed by laser irradiating, corona discharge, chemical corrosion, and grinding, to expose at least one accelerator, and alternatively a plurality of accelerators.

In an illustrative, non-limiting, embodiment, the surface of the plastic substrate may be irradiated by laser or corona discharge, causing plastic evaporation and forming a diagram in plastic substrate, preferably in a determined/predetermined area. In this way, a diagram may be formed on a surface of the plastic substrate, and accelerators in the diagram area may be exposed.

The laser instrument may be an infrared laser, or an ultraviolet laser, such as a $CO_2$ laser marking system. In a non-limiting embodiment, the laser may have a wavelength ranging from about 157 nanometers to about 10.6 microns; a scanning speed ranging from about 500 millimeters per second to about 8000 millimeters per second; a scanning step ranging from about 3 microns to about 9 microns; a delaying time ranging from about 30 microseconds to about 100 microseconds; a frequency ranging from about 30 kilohertz to about 40 kilohertz; a power ranging from about 3 watt to about 4 watt; and a filling space ranging from about 10 microns to about 50 microns.

The corona discharge instrument may be CW1003 corona discharge instrument provided by Sanxin Electronics Co., Ltd, Nantong, China. In a non-limiting embodiment, the corona discharge instrument may have a power ranging from more than zero to about 3 kilowatts and a speed ranging from about 1 meter per minute to about 20 meters per minute.

According to various embodiments of the present disclosure, the power of the laser or corona discharge instrument may be sufficiently great to expose at least one accelerator, and alternatively a plurality of accelerators, but not so strong as to alter or damage the accelerators, or reduce the accelerators to metals.

In a non-limiting embodiment, the chemical corrosion may be performed by a corrosion bath of N,N-dimethylformamide or tetrahydrofuran for a corrosion time ranging from about 5 minutes to about 60 minutes.

In a non-limiting embodiment, the grinding may be performed by a metallurgical sandpaper to remove the surface of the plastic substrate. In a non-limiting embodiment, the removed surface, portion, or layer, of the plastic substrate may have a thickness ranging from about 10 microns to about 50 microns, alternatively from about 10 microns to about 40 microns, alternatively from about 10 microns to about 30 microns, and alternatively from about 20 microns to about 50 microns. Stated another way, removing the surface, portion, or layer, of the plastic substrate may reduce the overall thickness of the plastic substrate by a thickness ranging from about 10 microns to about 50 microns, alternatively from about 10 microns to about 40 microns, alternatively from about 10 microns to about 30 microns, and alternatively from about 20 microns to about 50 microns.

In a non-limiting embodiment, the plastic substrate may have a thickness of—in one embodiment prior to and in another embodiment after removal—about 500 microns, or more, and the depth of the exposed portion of the plastic substrate may range from about hundreds of nanometers to less than about 100 microns. The determined area may have convexes and concaves in micro-structures, and copper may be filled in these micro-structures in the subsequent copper plating and forming strong adhesion between the substrate and the copper layer. In an embodiment, the areas without accelerators may not be irradiated, and, those areas may have low deposition speed and poor adhesion. While, a few metals may deposit in these areas they may be easily removed by, for example and without limitation, ultrasonic cleaning. In this manner, the metalization may be controlled in required areas in the surface of the plastic substrate.

First Plating

In an embodiment, after the accelerators are exposed in the surface of the plastic substrate, a copper and/or nickel plating may be introduced onto at least some of the accelerators.

In a non-limiting embodiment, after plastic removal the accelerator(s) may be exposed in at least a portion of the surface of the plastic substrate or the determined areas. Thereafter, copper-plating or nickel-plating may be applied to the accelerator(s). Methods of copper-plating and nickel-plating are generally known to those of ordinary skill in the art, and may include contacting the exposed plastic substrate with a copper-plating or a nickel-plating bath (described below). Without wishing to be bound by the theory, Applicant believes that the exposed accelerators may favor the copper or nickel ions, to be reduced to copper or nickel powders, which may cover the surface of the accelerators, and form a dense copper layer or nickel layer rapidly on the accelerators.

Further Plating

In a non-limiting embodiment, following the first plating, one or more chemical, or electroplating, layers may be applied to the copper layer or nickel layer, or plate. For example, after a first nickel layer, or plating, may be formed on the surface(s) of the accelerator(s), a copper layer, or plating, may be chemical plated on the first nickel layer, or plate, and then a second nickel layer, or plate, may be chemically plated on the copper layer, or plate, to form a composite plastic article, having a layer, or plate, structure of Ni—Cu—Ni. Alternatively, an aurum layer may be flash layered, or plated, on the composite plastic article to form a plastic article having a layer, or plate, structure of Ni—Cu—Ni—Au.

In a further illustrative, non-limiting, embodiment, after a first copper layer, or plating, is formed on the surface(s) of the accelerator(s), a nickel layer, or plate, may be plated on the first copper layer, or plate, to form a layer, or plate, structure of Cu—Ni. Alternatively, an aurum layer may be flash layered, or plated, on the Cu—Ni layer, or plate, to form a layer, or plate, structure of Cu—Ni—Au.

In various non-limiting embodiments, the nickel layer, or plate, may have a thickness ranging from about 0.1 microns to about 50 microns, alternatively from about 1 micron to about 10 microns, and alternatively from about 2 microns to about 3 microns. The copper layer, or plate, may have a thickness ranging from about 0.1 microns to about 100 microns, alternatively from about 1 microns to about 50 microns, and alternatively from about 5 microns to about 30 microns. The aurum layer may have a thickness ranging from about 0.01 microns to about 10 microns, alternatively from about 0.01 microns to about 2 microns, and alternatively from about 0.1 microns to about 1 microns.

Chemical plating baths, electric solutions, and flash plating baths are generally known to those of ordinary skill in the art. In a non-limiting embodiment, the chemical plating bath for copper plating may comprise a copper salt and a reducer, with a pH value ranging from about 12 to about 13, wherein the reducer may reduce the copper ion to copper. The reducer may be selected from the group consisting of glyoxylic acids, hydrazines, sodium hypophosphites, and combinations thereof. In another embodiment, the chemical plating bath for copper plating may comprise 0.12 moles per liter ("mol/L") $CuSO_4 \cdot 5H_2O$, 0.14 mol/L $Na_2EDTA \cdot 2H_2O$, 10 mol/L potassium ferrocyanide, 10 miligrams per liter ("mg/L") potassium ferrocyanide, 10 mg/L 2,2' bipyridine, and about 0.10 mol/L of glyoxylic acid (HCOCOOH), the bath having a pH ranging from about 12.5 to about 13 adjusted by NaOH and $H_2SO_4$ solutions. In a non-limiting embodiment, the copper plating time may range from about 10 minutes to about 240 minutes. The chemical plating bath for nickel plating may comprise about 23 grams per liter ("g/L") nickel sulfate, about 18 g/L inferior sodium phosphate, about 20 g/L lactic acid, about 15 g/L malic acid, the bath having a pH of about 5.2 adjusted by a NaOH solution, and a temperature of about 85° C. to about 90° C. In a non-limiting embodiment, the nickel plating time may range from about 8 minutes to about 15 minutes.

Aurum flash plating is generally known to those of ordinary skill in the art. In a non-limiting embodiment, the flash plating bath may be a BG-24 neutral aurum bath, which is commercially available from Shenzhen Jingyanchuang Chemical Company, located in Shenzhen, China.

The following examples provide additional details of some embodiments of the present disclosure:

EXAMPLE 1

In the first example:

a) A mixture of $Cu(NO_3)_2$ (0.5 mol/L) and $Fe(NO_3)_3$ (0.5 mol/L) was added into a stirred potassium hydroxide solution by a peristaltic pump with a speed of 1 milliliter per minute. The mixed solution was heated to a temperature of 80° C. and stirring was maintained for 24 hours, the PH value of the solution kept at 10 to 11 while stirring. The precipitates in the solution were cleaned with distilled water and acetone, and then penetrated. Finally, the penetrated precipitates were dried at a temperature of 120° C. for 24 hours and granulated to 300 meshes to form a first end product;

b) The first end product was calcined at temperature of 1000° C. for a time of 4 hours in the presence of high purity nitrogen, then granulated for a time of 10 hours to form $CuFe_2O_{4-\delta}$ ($0.05 \leq \delta \leq 0.8$) with an average diameter of 700 nanometers. The $CuFe_2O_{4-\delta}$ was chemically analyzed by the following steps: the mole quantity of Cu and Fe in $CuFe_2O_{4\delta}$ was tested by atomic absorption spectrometry (AAS); the $CuFe_2O_{4-67}$ was dissolved in HCl solution, in this step $Cu^+$ was oxidized to $Cu^{2+}$; the mole quantity of $Fe^{2+}$ was determined by ultraviolet spectrophotometry (UVS); according to the above mentioned steps, the mole quantities of $Cu^{2+}$, $Fe^{2+}$, $Fe^{3+}$ were all known, then the oxygen vacancy was calculated and it was determined that $\delta=0.35$. AAS was performed with an atomic absorption spectrophotometer, C10140, commercially available from PerkinElmer Inc., located in the US. UVS was performed with an UV spectrophotometer, UVmini-1240, commercially available from HVK Co., Ltd, located in Korea;

c) PC/ABS resin alloy, $CuFe_2O_{4-\delta}$ ($\delta=0.35$) powders, calcium silicate fiber, and antioxidant 1010 were mixed in a weight ratio of 100:10:30:0.2 in a high speed mixer to prepare a mixture; the mixture was then granulated in a twin screw extruder (provided from Nanjing Rubber & Plastics Machinery Plant Co., Ltd.) and then injection molded to form a plastic substrate for a circuit board of a LED lighting;

d) A metal circuit diagram was curved in a determined area of a surface of the plastic substrate with a DPF-M12 infrared laser, available from TIDE PHARMACEUTICAL CO., LTD, located in Beijing, China. The laser had a wavelength of 1064 nanometers, a scanning speed of 4000 millimeters per second, a step of 9 microns, a delaying time of 30 microseconds, a frequency of about 40 kilohertz, a power of 3 watt, and a filling space of 50 microns; the surface of the plastic article was then ultrasonically cleaned;

e) The plastic substrate was immersed in a nickel plating bath for 10 minutes to form a nickel layer having a thickness of 4 microns on the accelerators; the plastic substrate was immersed in a copper plating bath for 4 hours to form a copper layer having a thickness of 15 microns on the nickel layer; thereafter, the plastic substrate was immersed in a nickel plating bath for 10 minutes to form a nickel layer having a thickness of 5 microns on the copper layer; then the plastic substrate was flash plated with an aurum layer having a thickness of 0.03 microns on the nickel layer; where the copper plating bath comprised 0.12 mol/L $CuSO_4 \cdot 5H_2O$, 0.14 mol/L $Na_2EDTA \cdot 2H_2O$, 10 mg/L potassium ferrocyanide, 10 mg/L 2,2' bipyridine, 0.10 mol/L glyoxylic acid, having a pH of from 12.5 to 13, which was adjusted by NaOH and $H_2SO4$ solutions; the nickel plating bath comprised 23 g/L nickel sulfate, 18 g/L inferior sodium phosphate, 20 g/L lactic acid, 15 g/L malic acid, the bath had a PH value of about 5.2; the flash plating bath was BG-24 neutral aurum bath, which was obtained from SHENZHEN JINGYANCHUANG CHEMICAL COMPANY, located in Shenzhen, China; the plastic substrate was formed into a plastic article for a circuit board.

EXAMPLE 2

In the second example:

a) A mixture of CaCO3, CuO, and $TiO_2$ powders were evenly mixed according to a stoichiometric ratio of $Ca_{0.25}Cu_{0.75}TiO_3$, and then milled in a ball mill for a milling time of 8 hours, with absolute alcohol as the milling mediate. The milled mixture was pre-calcined at a temperature of 800° C. for a time of 10 hours to form $Ca_{0.25}Cu_{0.75}TiO_3$ powders.

b) The $Ca_{0.25}Cu_{0.75}TiO_3$ powders were calcined at temperature of 900° C. for a time of 4 hours in the presence of argon, then granulated to form $Ca_{0.25}Cu_{0.75}TiO_{3-\beta}$ with an average diameter of 500 nanometers. The $Ca_{0.25}Cu_{0.75}TiO_{3-\beta}$ was chemically analyzed, according to the same method described in the first example, and it was determined that $\beta=0.16$.

c) PP resin, $Ca_{0.25}Cu_{0.75}TiO_{3-\beta}(\beta=0.16)$ powders, antioxidant 1010, and polyethylene wax were mixed in a weight ratio of 100:10:0.2:0.1 to prepare a mixture; the mixture was granulated then injection molded to form an plastic substrate for a shell of an electric connector;

d) A metal circuit diagram was curved in a determined area of a surface of the plastic substrate with a CW1003 corona discharge instrument commercially available from Sanxin Electronics Co., Ltd, located in Nantong, China. The instrument had a speed of 1 meter per minute and a power of 2 kilowatt.

e) The plating step was in the same manner as in step (e) of EXAMPLE 1, with the following exceptions: the plastic substrate was immersed in a nickel plating bath for 8 minutes to form a nickel layer having a thickness of 2 microns on the accelerators; the plastic substrate was immersed in a copper plating bath for 4 hours to form a copper layer having a thickness of 15 microns on the nickel layer; thereafter, the plastic substrate was immersed in a nickel plating bath for 10 minutes to form a nickel layer having a thickness of 3 microns on the copper layer; and then the plastic substrate was flash plated with an aurum layer having a thickness of 0.03 microns on the nickel layer.

EXAMPLE 3

In the third example, the plastic article was prepared in the same manner as in EXAMPLE 1, with the following exceptions:

In step c) titanium black (average diameter of 50 nanometers, $TiO_{2-\sigma}$, $\sigma=1$, Tilack, commercially from Akoh Kasei Company, located in Japan), PP resin, calcium silicate fiber, and antioxidant 1010 were mixed in a weight ratio of 100:10:30:0.2 in a high speed mixer to prepare a mixture; the mixture was then granulated in a twin screw extruder (provided from Nanjing Rubber & Plastics Machinery Plant Co., Ltd.) and then injection molded to form an plastic substrate for a circuit board of an LED lighting;

In step d) the metal circuit diagram was curved in a determined area of a surface of the plastic substrate by chemical corrosion, with a corrosion material of N,N-dimethylformamide and a corrosion time of 30 minutes.

EXAMPLE 4

In the fourth example, the plastic article was prepared in the same manner as in EXAMPLE 2, with the following exceptions:

In step c) the mixture was granulated then injection molded to form an plastic substrate for a component of bath equipments; and In step d) all the surface of the plastic substrate was polished by a metallurgical sandpaper, and the exposed portion of the plastic substrate had a depth of 20 microns.

What is claimed is:

1. A method of metalizing a plastic substrate comprising:
    providing a plastic substrate having accelerators dispersed in the plastic substrate, the accelerators having a formula of $Ca_{0.25}Cu_{0.75}TiO_{3-\beta}$, wherein $\beta$ denotes oxygen vacancies in corresponding accelerators and $0.05 \leq \beta \leq 0.5$;
    removing, by laser, at least a portion of a surface of the plastic substrate to expose the accelerators, wherein the power of the laser is less than the power to reduce the accelerators to pure metals; and
    plating the exposed surface of the plastic substrate to form at least a first metal layer.

2. The method of claim 1, wherein the laser has a wave length of about 10.6 microns.

3. The method of claim 1, wherein the laser has a power ranging from about 3 watts to about 4 watts.

4. The method of claim 1, wherein the accelerators include accelerators with a formula of $Ca_{0.25}Cu_{0.75}TiO_{2.84}$.

5. The method of claim 1, wherein the accelerators include accelerators with a formula of $Ca_{0.25}Cu_{0.75}TiO_{2.5}$.

6. The method of claim 1, wherein the plastic substrate further comprises at least one additive selected from the group consisting of: an antioxidant, a light stabilizer, a lubricant, and inorganic fillers.

7. The method of claim 1, wherein providing a plastic substrate having accelerators dispersed in the plastic substrate comprises:
    calcining $Ca_{0.25}Cu_{0.75}TiO_3$ powder to obtain accelerators having a formula of $Ca_{0.25}Cu_{0.75}TiO_{3-\beta}$, wherein $\beta$ denotes oxygen vacancies in corresponding accelerators and $0.05 \leq \beta \leq 0.5$; and
    dispersing the accelerators in a plastic material and molding the plastic material to form the plastic substrate.

8. The method of claim 1, wherein providing a plastic substrate having accelerators dispersed in the plastic substrate comprises:
    mixing $CaCO_3$, $CuO$, and $TiO_2$;
    heating the mixture to form $Ca_{0.25}Cu_{0.75}TiO_3$ powder;
    calcining the $Ca_{0.25}Cu_{0.75}TiO_3$ powder to obtain accelerators having a formula of $Ca_{0.25}Cu_{0.75}TiO_{3-\beta}$, wherein $\beta$ denotes oxygen vacancies in corresponding accelerators and $0.05 \leq \beta \leq 0.5$; and
    dispersing the accelerators in a plastic material and molding the plastic material to form the plastic substrate.

9. The method of claim 1, wherein the accelerators have an average diameter of 500 nanometers.

10. A method of metalizing a plastic substrate comprising:
    providing a plastic substrate having accelerators dispersed in the plastic substrate, the accelerators having a formula selected from the group of: $CuFe_2O_{4-\delta}$, $Ca_{0.25}Cu_{0.75}TiO_{3-\beta}$, and $TiO_{2-\sigma}$, wherein $\delta$, $\beta$, $\sigma$ denotes oxygen vacancies in corresponding accelerators and $0.05 \leq \delta \leq 0.8$, $0.05 \leq \beta \leq 0.5$, and $0.05 \leq \sigma \leq 1.0$;
    removing at least a portion of a surface of the plastic substrate to expose at least a first accelerator, wherein the power used to remove the portion of the surface of the plastic substrate is less than the power to reduce the accelerators to pure metals; and
    plating the exposed surface of the plastic substrate to form at least a first metal layer.

11. The method of claim 10, wherein removing at least a portion of a surface of the plastic substrate includes removing, by a laser, at least a portion of a surface of the plastic substrate, and the laser has a wave length of about 10.6 microns.

12. e method of claim 11, wherein the laser has a power ranging from about 3 watts to about 4 watts.

13. The method of claim 10, wherein the plastic substrate further comprises at least one additive selected from the group consisting of: an antioxidant, a light stabilizer, a lubricant, and inorganic fillers.

\* \* \* \* \*